Figure 1:
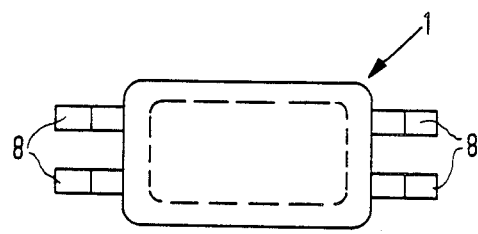

United States Patent [19]

Fick

[11] Patent Number: 4,676,816

[45] Date of Patent: Jun. 30, 1987

[54] METHOD OF MANUFACTURING A HERMETICALLY SEALED COMPONENT HOUSING, IN PARTICULAR FOR QUARTZ RESONATORS

[75] Inventor: Franz Fick, Hamburg, Fed. Rep. of Germany

[73] Assignee: U.S. Philips Corporation, New York, N.Y.

[21] Appl. No.: 870,270

[22] Filed: Jun. 3, 1986

[30] Foreign Application Priority Data

Jun. 5, 1985 [DE] Fed. Rep. of Germany ....... 3520085

[51] Int. Cl.[4] .................... C03B 23/24; C03C 27/02
[52] U.S. Cl. .......................................... 65/43; 65/59.2; 65/59.21; 65/59.25; 65/59.31
[58] Field of Search ................. 65/43, 40, 59.1, 59.21, 65/59.23, 59.25, 59.31, 138

[56] References Cited

U.S. PATENT DOCUMENTS

| | | | |
|---|---|---|---|
| 2,177,502 | 10/1939 | Stack | 65/59.23 |
| 2,527,720 | 10/1950 | Guyer | 65/43 X |
| 3,271,124 | 9/1966 | Clark | 65/59.23 X |
| 3,519,409 | 7/1970 | Stutzman | 65/43 X |
| 4,294,602 | 10/1981 | Horne | 65/40 |

FOREIGN PATENT DOCUMENTS

D6652 12/1952 Fed. Rep. of Germany.
2004928 2/1970 Fed. Rep. of Germany.
26144372 10/1976 Fed. Rep. of Germany.

Primary Examiner—Arthur Kellogg
Attorney, Agent, or Firm—Norman N. Spain

[57] ABSTRACT

The invention relates to a method of manufacturing a hermetically sealed component housing having a tray-like upper portion and a tray-like lower portion of an insulating material, which portions are hermetically sealed to each other, the lead-in conductors to the component being accommodated in the junction between the upper and lower portion of the housing. The lead-in conductors to the component are so formed that they partially extend in a longitudinal direction between the connecting surfaces of the upper portion and the lower portion of the housing, and the housing portions with the intermediate lead-in conductors are interconnected by heating in a high-frequency field the individual lead-in conductors, which are interconnected to form an annular conductor, until the housing portions are interconnected.

7 Claims, 4 Drawing Figures

METHOD OF MANUFACTURING A HERMETICALLY SEALED COMPONENT HOUSING, IN PARTICULAR FOR QUARTZ RESONATORS

The invention relates to a method of manufacturing a hermetically sealed component housing, which can be mounted directly on a printed circuit board and which has a tray-like upper portion and a tray-like lower portion of an insulating material, which portions are hermetically sealed to each other, the lead-in conductors to the component being accommodated in the junction between the upper and lower portion of the housing.

Such a method is known from GB-A 21 46 839.

In the housing manufactured in accordance with the said known method, the housing portions are interconnected by means of, preferably, an adhesive.

However, a reliable and solid joint can only be obtained by means of direct fusing, or fusing using a solder. In the case of the known method this would imply heating the entire housing thereby surely damaging the enclosed component.

Consequently, it is an object of the invention to provide a method of the type mentioned in the opening paragraph, such that the housing portions can be fused together, whether or not using a solder, by supplying a minimum of heat and without damaging the enclosed component.

The invention is based on the recogniton that the heat necessary for the fusing process should only be produced at the fusion area.

Making use of this recognition, the object of the invention is achieved by 1. so forming the lead-in conductors connected to the component that they partially extend in a longitudinal direction between the connecting surfaces of the upper portion and lower portion of the housing, 2. interconnecting the housing portions with the intermediate lead-in conductors by heating in a high frequency field the individual lead-in conductors which are interconnected to form an annular conductor, until the housing portions are sealed together.

Such a method has the advantage that due to induction heating of the lead-in conductors located between the connecting areas, the heat is conducted only to the fusion area thereby precluding overheating of the component.

A few embodiments of the invention will now be described in more detail with reference to the accompanying drawings.

Figure 2:
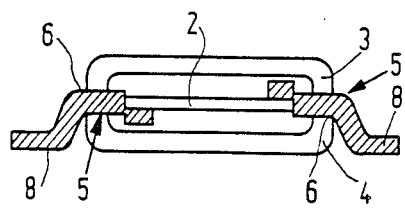
Figure 3:
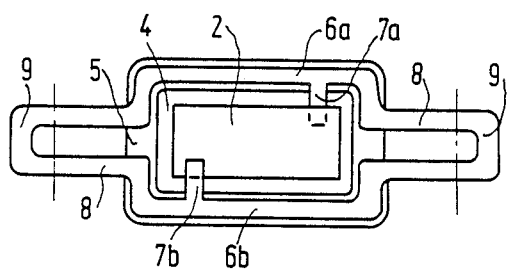
Figure 4:
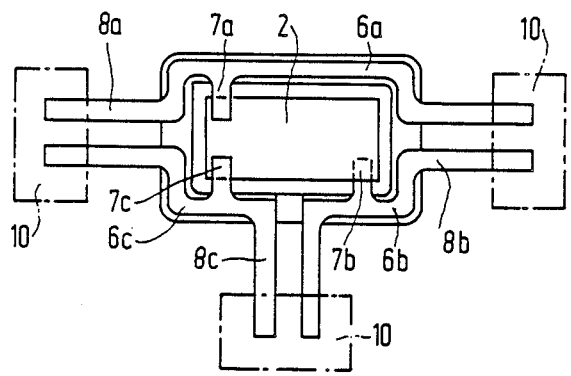

FIG. 1 is a schematic plan view of a component housing manufactured by a method in accordance with the invention, FIG. 2 is a sectional view of the housing in accordance with FIG. 1, FIG. 3 is a plan view of a portion of the housing, showing lead-in conductors provided on the connection areas in accordance with a first exemplary embodiment, FIG. 4 is a top view as in FIG. 3, in accordance with a second exemplary embodiment.

FIGS. 1 and 2 are a plan view and a longitudinal view (FIG. 2) of a component housing 1 manufacture by a method in accordance with the invention. The said housing consists of a tray-like upper portion 3 and a tray-like lower portion 4 both, which portions are hermetically sealed to each other, the lead-in conductors 8 to the component connected 2 in the housing being accommodated in the junction between the upper and lower portions of the housing. Such a component housing 1 having suitably formed lead-out conductors 8, i.e. bent downwards as shown in FIGS. 1 and 2, can readily be mounted on a printed circuit board using automatic insertion machines and soldered to its tracks.

The manufacture of such a component housing having two times 2 or three times 2 lead-out conductors is further explained in the FIGS. 3 and 4, respectively.

FIG. 3 shows a lower portion 4 of a housing having a tray-like shape and the edge of which serves as the connection are 5 with the correspondingly shaped upper portion of the housing. The lead-in conductors 6 connected to the components arranged in the housing are so arranged on the connection area 5 of the lower portion 4 of the housing that they form a continuous annular conductor which extends over the major part of the connection area 5. More specifically, this annular conductor consists of the portions 6a and 6b which extend over the connection area and have pins 7a and 7b to which the component 2 is connected either directly as shown in the Figure or through connection wires, and of the ends 8 of the lead-in conductors, which extend outside the housing and interconnections 9 between and joining the neighbouring ends 8 of the lead-in conductors. The entire conductive system made up of the portions 6 and 9 is manufactured in one piece from a suitable, heat-resistant and sufficiently conductive material, such as for example Kovar, after which it is positioned on the lower portion of the housing, and the component 2 accommodated in the said lower portion 4 is connected to the pins 7b. This stage of the system is shown in FIG. 3. Next, the upper portion 3 of the housing with its connection surface 5 is positioned and pressed onto the lower portion carrying the annular conductive system.

Subsequently, the assembly is subjected to a high frequency field which heats the annular conductive system 6 to 9 to such a temperature that the fusion of the upper 3 and lower 4 portions of the housing, including the conductor 6, takes place. For this purpose, the width of the conductor portions relative to that of the connection area 5 should be suitably selected.

For the sake of clarity, the conductors 6 to 8 are represented so as to be excessively thick in FIG. 2, however, it may be necessary to so shape the connection areas 5 of the lower and upper portions of the housing that upon assembling the system consisting of lower portion 4 of the housing, upper portion 3 and lead-in conductors 6 to 9 all parts fit together without forming joints.

It may further be advantageous to cover the connection area 5 and/or conductor portions 6, prior to assembly, with a suitable material having a low melting point, such as for example a glass solder. In this case, the annular conductor system 6 to 9 does not have to be heated to such high temperatures in the high frequency field that the material of the housing portions become ductile, but only to the temperature at which the soldering material liquefies.

Heating and sealing is preferably carried out in an inert atmosphere or in a vacuum, in order to prevent both oxidation of the conductor material during the heating operation as well as to provide an advantageous surrounding to the component 2 accommodated in the hermetically sealed housing. Subsequently, the conductor portions 9 which interconnect the neighbouring ends 8 of the lead-in conductors are severed, and the ends of the lead-in conductors are suitably formed so as to obtain the component housing as shown in the FIGS. 1 and 2 and the ends 8 are suitable for introduction into the bore holes of a printed circuit board.

The exemplary embodiment in accordance with FIG. 4 largely corresponds to that shown in FIG. 3; however, the component 2 is provided with three leads. Accordingly, the annular conductor system consists of three parts, i.e. there are three portions of the lead-in conductors 6a, 6b, and 6c positioned on the connection area, three pins 7a, 7b and 7c and two times three ends 8a, 8b and 8c of the lead-in conductors. Moreover, the lead-in conductors, unlike the exemplary embodiment in accordance with FIG. 3, are not in one piece, but in three pieces 6a to 8a, 6b to 8b and 6c to 8c, which are interconnected using contact links 10 (shown in broken lines) after the assembly of upper portion 3 and lower portion 4 of the housing, component 2 and lead-in conductors 6 to 8 are introduced into the high-frequency field. These contact links 10 may be mechanical contacts which, so long as a closed-loop conductor should be formed in the high-frequency field, are each pressed onto two neighbouring ends 8 of the lead-in conductors, thereby interconnecting them.

Both in the method in accordance with FIG. 3 and with FIG. 4, the number of lead-in conductors can be increased, consequently, a component having more than two times 3 lead-in conductors can be manufactured.

The method described herein is particularly suitable for the manufacture of hermetically sealed housings for individual quartz resonators or quartz filters. In this case the housing portions are preferably also made of glass. However, the housing portions may also consist of a ceramic material, in which case they are interconnected by means of solder and fused with the portions 6 of the lead-in conductors.

What is claimed is:

1. A method of manufacturing a hermetically sealed component housing which can be mounted directly on a printed circuit board, and which has a tray-like upper portion and a tray-like lower portion of an insulating material having junctions therebetween, which portions are hermetically sealed to each other, the lead-in conductors to the component being accommodated in the junctions between the upper and lower portions of the housing, characterized in that
    (a) the lead-in conductors (6) connected to the component (2) are so formed that partially extend in a longitudinal direction between connecting surfaces (5) of the upper portion (3) and the lower portion (4) of the housing,
    (b) the housing portions (3, 4) with the lead-in conductors 6 are interconnected by heating in a high frequency field the individual lead-in conductors (6) which are interconnected to form an annular conductor until the housing portions are sealed.

2. A method as claimed in claim 1, characterized in that the lead-in conductors (6) are interconnected to form an annular conductor in that neighbouring ends (8) of the lead-in conductors (6) which extend outside the housing are interconnected.

3. A method as claimed in claim 2, characterized in that the lead-in conductors (6) are manufactured as annular conductors in one piece, and the interconnections (9) between the ends (8) of the lead-in conductors (6) are severed after fusion of the housing portions (3, 4).

4. A method as claimed in claim 2, characterized in that the neighbouring ends (8) of the individual lead-in conductors (6) are interconnected during heating in a high frequency field by individual contact links.

5. A method as claimed in claim 1, characterized in that prior to connecting at least one connecting surface (5) is coated with a low melting point connecting material.

6. A method as claimed in any one of the claims 1 to 4, characterized in that the ends (8) of the lead-in conductors which are positioned outside the housing are so formed that they are suitable for soldering the component housing (1) onto a printed circuit board.

7. A method as claimed in anyone of the claims 1 to 4, characterized in that the ends (8) of the lead-in conductors (6), situated outside the housing (1) are so formed that they are suitable for introduction into the bore holes of a printed circuit board.

* * * * *